United States Patent
Liao et al.

(10) Patent No.: US 8,709,910 B2
(45) Date of Patent: Apr. 29, 2014

(54) SEMICONDUCTOR PROCESS

(75) Inventors: Chin-I Liao, Tainan (TW); Chia-Lin Hsu, Tainan (TW); Yung-Lun Hsieh, Tainan (TW); Chien-Hao Chen, Yun-Lin County (TW); Bo-Syuan Lee, Tainan (TW); Min-Chung Cheng, Chiayi County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 40 days.

(21) Appl. No.: 13/459,262

(22) Filed: Apr. 30, 2012

(65) Prior Publication Data
US 2013/0288448 A1 Oct. 31, 2013

(51) Int. Cl.
*H01L 21/76* (2006.01)

(52) U.S. Cl.
USPC .......... 438/429; 438/360; 257/E21.562; 257/E21.566

(58) Field of Classification Search
CPC ............ H01L 21/763; H01L 21/823; H01I 21/823481
USPC .......... 438/429, 360, 337, 589; 257/E21.562, 257/E21.566, E21.621, E21.635
See application file for complete search history.

(56) References Cited

U.S. PATENT DOCUMENTS

| | | | |
|---|---|---|---|
| 6,043,138 A | 3/2000 | Ibok | |
| 6,162,700 A * | 12/2000 | Hwang et al. | 438/424 |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon | |
| 7,781,771 B2 | 8/2010 | Lindert | |
| 2001/0024869 A1 * | 9/2001 | Ping | 438/586 |
| 2003/0211683 A1 * | 11/2003 | Kim | 438/221 |
| 2004/0099928 A1 * | 5/2004 | Nunan et al. | 257/640 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |
| 2012/0032239 A1 * | 2/2012 | Huang et al. | 257/288 |

\* cited by examiner

*Primary Examiner* — Caridad Everhart
(74) *Attorney, Agent, or Firm* — Winston Hsu; Scott Margo (57) ABSTRACT

A semiconductor process includes the following steps. A semiconductor substrate is provided. The semiconductor substrate has a patterned isolation layer and the patterned isolation layer has an opening exposing a silicon area of the semiconductor substrate. A silicon rich layer is formed on the sidewalls of the opening. An epitaxial process is performed to form an epitaxial structure on the silicon area in the opening.

18 Claims, 6 Drawing Sheets

SEMICONDUCTOR PROCESS

BACKGROUND OF THE INVENTION

1. Field of the Invention

The present invention relates generally to a semiconductor process, and more specifically to a semiconductor process, which forms a silicon rich layer on the sidewalls of an isolation structure so that an epitaxial structure can grow on the silicon rich layer.

2. Description of the Prior Art

For decades, chip manufacturers have made metal-oxide-semiconductor (MOS) transistors faster by making them smaller. As the semiconductor processes advance to very deep sub micron era, such as 65-nm node or beyond, how to increase the driving current for MOS transistors has become a critical issue.

In order to improve device performances, strained-silicon technology has been developed. Strained-silicon technology is becoming more and more attractive as a means for getting better performances in the field of MOS transistor fabrication. Putting a strain on a semiconductor crystal alters the speed at which charges move through that crystal. Strain makes MOS transistors work better by enabling electrical charges, such as electrons, to pass more easily through the silicon lattice of the gate channel.

However, some problems occur while applying strained-silicon technologies. By using a fin-shaped field-effect transistor as an example, the fin-shaped field-effect transistor includes at least a fin-shaped structure and isolation structures that are located between the fin-shaped structures. As epitaxial structures grow on the fin-shaped structures by applying strained-silicon technologies, gaps are generated between the epitaxial structures and the isolation structures because the epitaxial structures can not grow on the isolation structures. Since the epitaxial structures can not fill up spaces between the isolation structures, the volume of the epitaxial structures tend to be reduced and the desired shapes for the epitaxial structures can not be obtained. Thus, the performances of the epitaxial structures would decrease. Besides, structures such as a gate structure, an interdielectric layer, a contact hole etch stop layer, a metal plug or the likes formed above the epitaxial structures cannot contact the epitaxial structures smoothly, thereby decreasing the quality of the fin-shaped field-effect transistor.

SUMMARY OF THE INVENTION

The present invention provides a semiconductor process, which forms a silicon rich layer on the sidewalls of an isolation layer so that an epitaxial structure formed on the semiconductor substrate can grow on the silicon rich layer.

The present invention provides a semiconductor process including the following steps. A semiconductor substrate is provided, wherein the semiconductor substrate has a patterned isolation layer, and an opening of the patterned isolation layer exposes a silicon area of the semiconductor substrate. A silicon rich layer is formed on the sidewalls of the opening. An epitaxial process is performed to form an epitaxial structure on the silicon area in the opening.

According to the above, the present invention provides a semiconductor process, which forms a silicon rich layer on the sidewalls of an isolation layer so that an epitaxial structure formed on the semiconductor substrate can grow on the silicon rich layer. By doing this, the epitaxial structure of the present invention can adhere to the patterned isolation layer; therefore the performance of the epitaxial structure can be improved.

These and other objectives of the present invention will no doubt become obvious to those of ordinary skill in the art after reading the following detailed description of the preferred embodiment that is illustrated in the various figures and drawings.

DETAILED DESCRIPTION

There are two embodiments presented in the following paragraphs, which describe the formation of an epitaxial structure in a fin-shaped field-effect transistor. However, the semiconductor process of the present invention can also be applied to a bulk semiconductor substrate to form a planar transistor, but it is not limited thereto.

Figure 1:
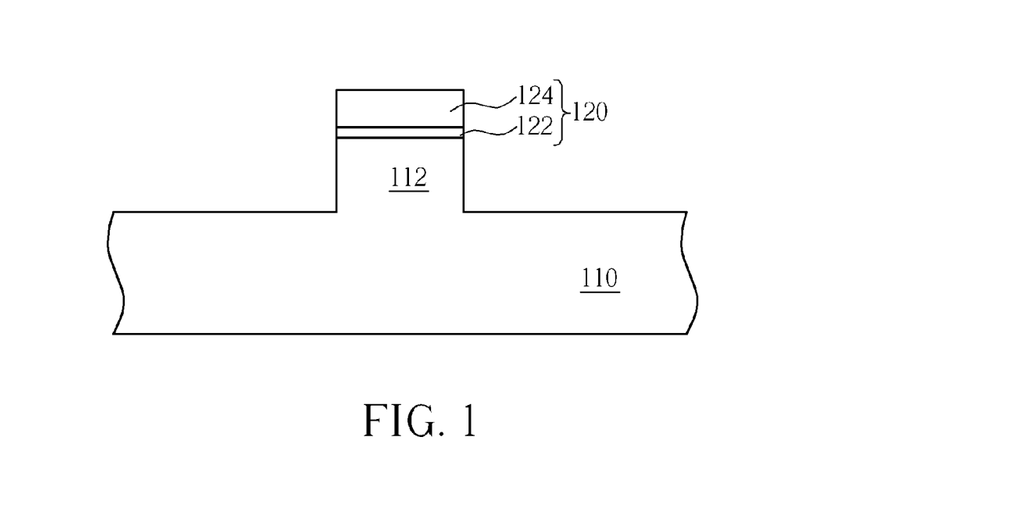
FIGS. 1-8 schematically depict cross-sectional views of a semiconductor process according to a first embodiment of the present invention.

FIGS. 1-8 schematically depict cross-sectional views of a semiconductor process according to a first embodiment of the present invention. FIG. 9 schematically depicts a three dimensional diagram of a semiconductor process according to a first embodiment of the present invention. As shown in FIG. 1, a semiconductor substrate 110 is provided. The semiconductor substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The semiconductor substrate 110 has a fin-shaped structure 112. The fin-shaped structure 112 may be formed by a method described in the following paragraph, but it is not limited thereto. A bulk substrate (not shown) is provided. A patterned hard mask layer 120 may be formed thereon for defining the location of the fin-shaped structure 112. The patterned hard mask layer 120 may include an oxide layer 122 and a nitride layer 124. An etching process is performed to form at least a fin-shaped structure 112 in the bulk substrate (not shown). This means that the fabrication of the fin-shaped structure 112 is finished. In this embodiment, the patterned hard mask layer 120 is removed after the fin-shaped structure 112 is formed, and a tri-gate MOSFET can be formed in the following processes. There are three contact faces between the fin structure 112 and the later formed dielectric layer functioning as a carrier channel which width is wider than a channel width of a conventional planar MOSFET. When a driving voltage is applied, the tri-gate MOSFET produces twice the on-current of a conventional planar MOSFET.

The present invention can also be applied to other semiconductor substrates. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown)

is exposed, meaning then that the fin-shaped structure formed in the silicon-on-insulator substrate (not shown) is fabricated.

For clarifying the present invention, one fin-shaped structure 112 is depicted in this embodiment, but the present invention can also be applied to a plurality of fin-shaped structures 112.

Figure 2:
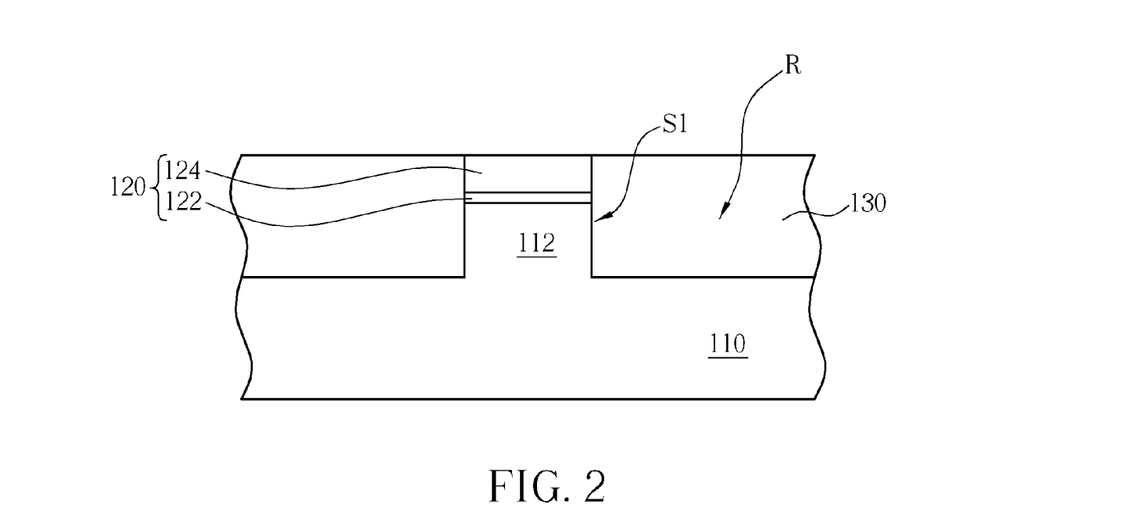

As shown in FIG. 2, a patterned isolation layer 130 is formed in the semiconductor substrate 110. The method of forming the patterned isolation layer 130 may include the following steps, but not limited to. After the fin-shaped structure 112 is formed on the semiconductor substrate 110, a plurality of recesses R are also formed in the semiconductor substrate 110 because of the etching of the semiconductor substrate 110 surrounding the fin-shaped structure 112. A liner (not shown) may be selectively formed on the sidewalls S1 and the bottom surface of each of the recesses R, and the liner (not shown) may be a nitride layer or an oxide/nitride (ON) layer. An isolation material (not shown) is filled in each of the recesses R and then an etching process or a planarization process is performed, meaning then that the fabrication of the patterned isolation layer 130 is finished. In this embodiment, the patterned isolation layer 130 is a shallow trench isolation structure. In another embodiment, the patterned isolation layer 130 may be another isolation structure formed by other methods. Otherwise, the hard mask layer 120 can be used as a stop layer as the planarization process is performed. As the patterned isolation layer 130 is formed by the etching process, the opening of the patterned isolation layer 130 may be larger than or equal to the width of the fin-shaped structure 112. As the opening of the patterned isolation layer 130 is larger than the width of the fin-shaped structure 112, epitaxial structures formed in sequential processes can be formed on two sidewalls of the fin-shaped structure 112.

Figure 3:
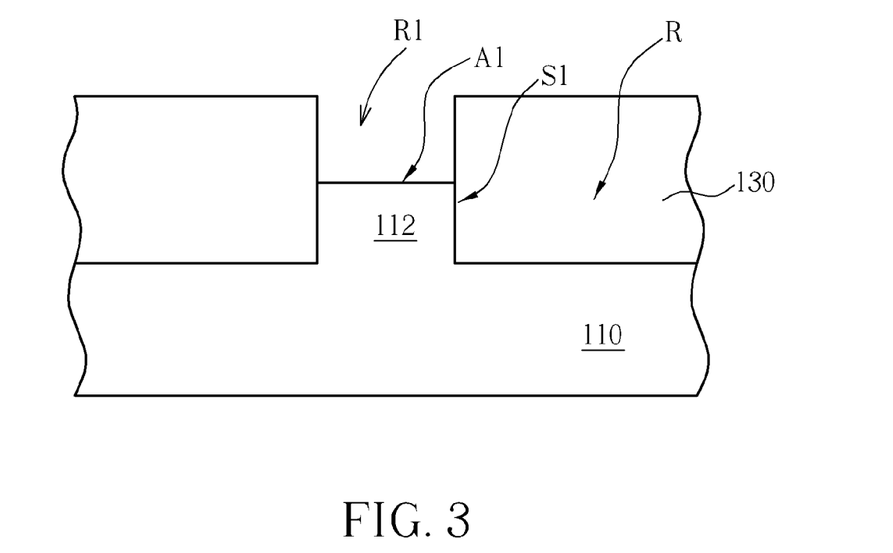

As shown in FIG. 3, the hard mask layer 120 is removed. At least an opening R1 of the patterned isolation layer 130 is formed to expose a silicon area A1 of the semiconductor substrate 110. In other words, the silicon area A1 is the top surface of the fin-shaped structure 112.

Figure 4:
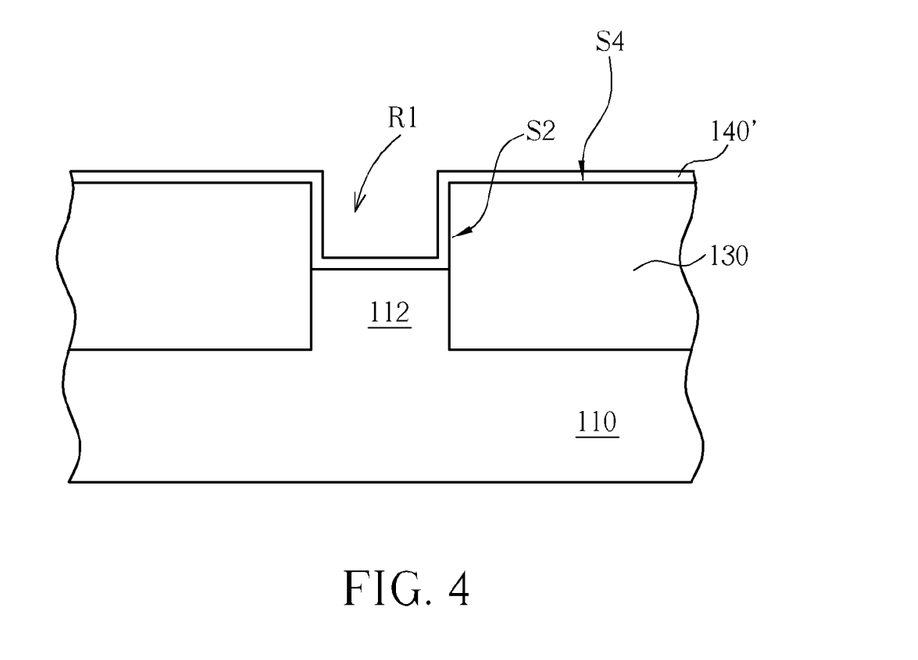
Figure 5:
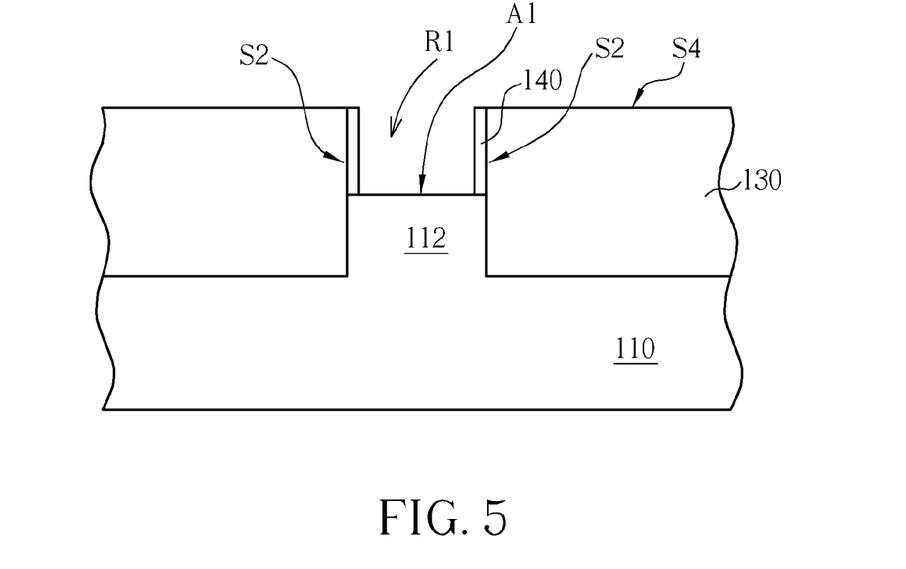

As shown in FIGS. 4-5, a silicon rich layer 140 is formed on the sidewalls S2 of the opening R1. As shown in FIG. 4, a silicon rich film 140' is entirely formed on the semiconductor substrate 110, the sidewalls S2 and the top surface S4 of the patterned isolation layer 130 by processes such as a deposition process. As shown in FIG. 5, the silicon rich film 140' on the semiconductor substrate 110 and on the top surface S4 of the patterned isolation layer 130 are removed by methods such as an etching process so that the silicon area A1 is exposed.

It is worth noting that a silicon rich layer 140 is especially formed on the sidewalls S2 of the patterned isolation layer 130 in the present invention, so that the epitaxial structure formed on the fin-shaped structure 112 in following processes can grow on the silicon rich layer 140. The epitaxial structure can therefore adhere to the patterned isolation layer 130 without having gaps between them, as described in the prior art, that would decrease the performances of the epitaxial structures and degrade the performances of the fin-shaped field effect transistor. Specifically, the silicon content of the silicon rich layer 140 is larger than one-third of the total content of the silicon rich layer 140. In one embodiment, the silicon rich layer 140 is a dielectric layer, but it is not limited thereto. Thus, the silicon content of the silicon rich layer 140 can be larger than the silicon content of the patterned isolation layer 130, such as a silicon dioxide layer, therefore the epitaxial structure is easier to grow on the silicon rich layer 140 than on the patterned isolation layer 130. In this embodiment, the silicon rich layer 140 may include a nitrogen containing silicon rich layer. In a preferred embodiment, the silicon rich layer 140 may include a silicon nitride ($Si_3Ni_4$) layer.

Figure 6:
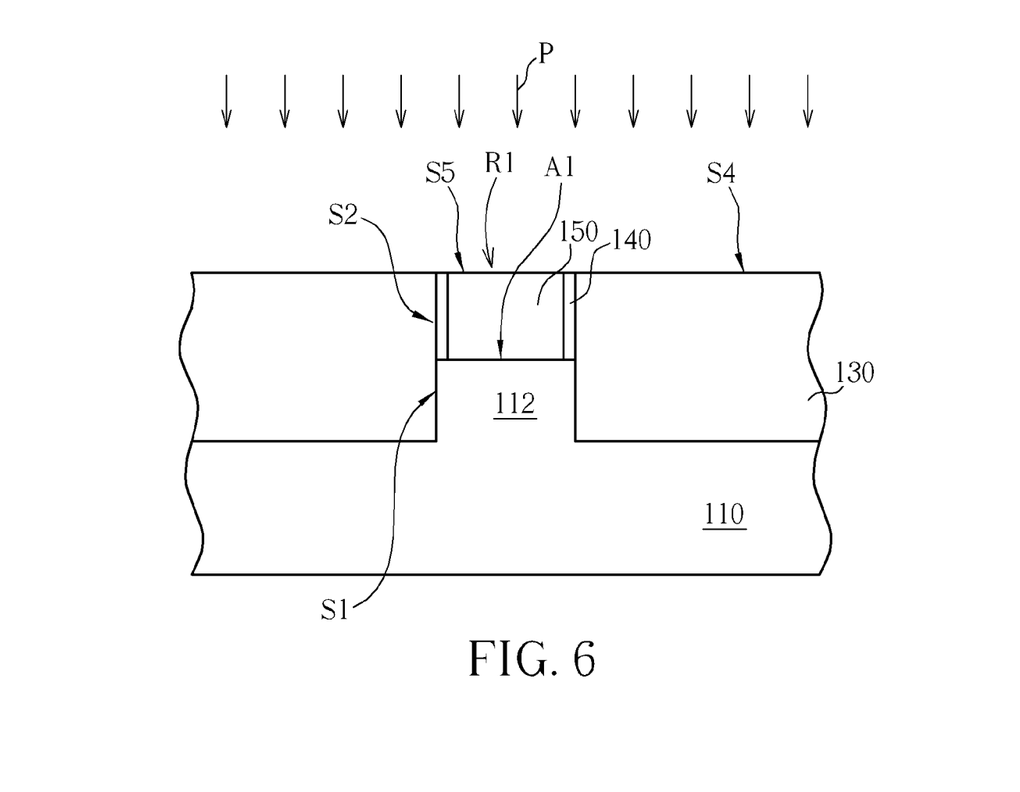

As shown in FIG. 6, an epitaxial process P is performed to form an epitaxial structure 150 on the silicon area A1 in the opening R1. The epitaxial structure 150 comprises a silicon-germanium epitaxial structure, a silicon carbide epitaxial structure and a silicon epitaxial structure, but it is not limited thereto, depending upon the electrical properties and the applications of the formed transistor. In this embodiment, the top surface S5 of the epitaxial structure 150 is leveled with the top surface S4 of the patterned isolation layer 130. In another embodiment, the top surface S5 of the epitaxial structure 150 protrudes from the patterned isolation layer 130. The top surface S5 of the epitaxial structure 150 may also be below the top surface S4 of the patterned isolation layer 130. The relative position of the top surface S5 of the epitaxial structure 150 and the top surface S4 of the patterned isolation layer 130 depends upon the desired structure to be formed and the subsequent processes.

Figure 7:
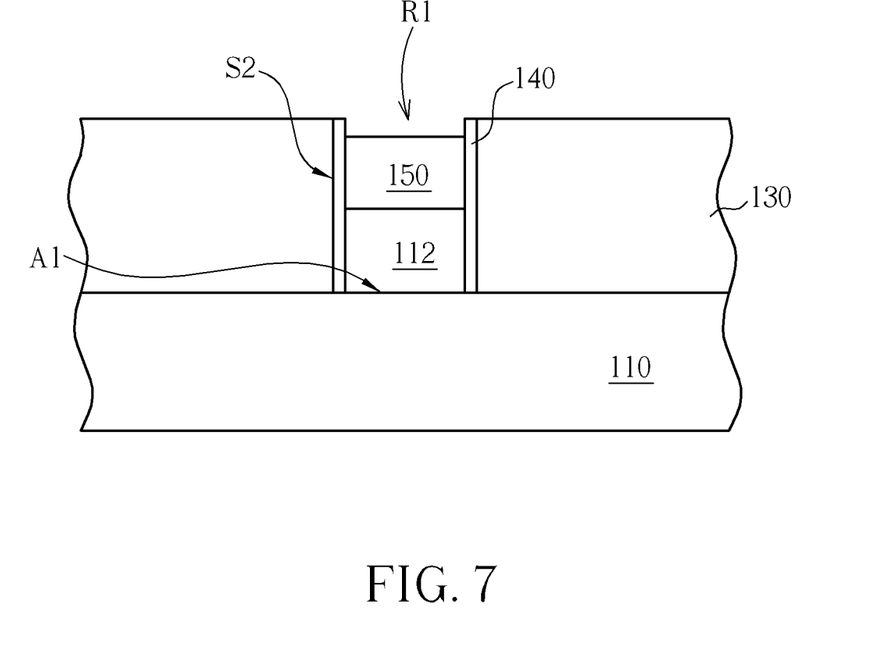

As shown in FIG. 7, in another embodiment, a patterned isolation layer 130 may be directly formed on a semiconductor substrate 110. Then, a silicon rich layer 140 is formed on the sidewalls S2 of at least an opening R1 of the patterned isolation layer 130. An epitaxial process is performed to sequentially form a fin-shaped structure 112 and an epitaxial structure 150 on a silicon area A1 of the semiconductor substrate 110, or to form an epitaxial structure 150 on the silicon area A1 to become a fin-shaped structure. Likewise, the epitaxial structure 150 can also grow on the silicon rich layer 140, enabling the epitaxial structure 150 to adhere to the patterned isolation layer 130, thereby avoiding gaps between the epitaxial structure 150 and the patterned isolation layer 130. Besides, the top surface of the epitaxial structure 150 may protrude from, be leveled with, or be below the surface of the patterned isolation layer 130, depending upon the desired structures and the sequential processes.

Figure 8:
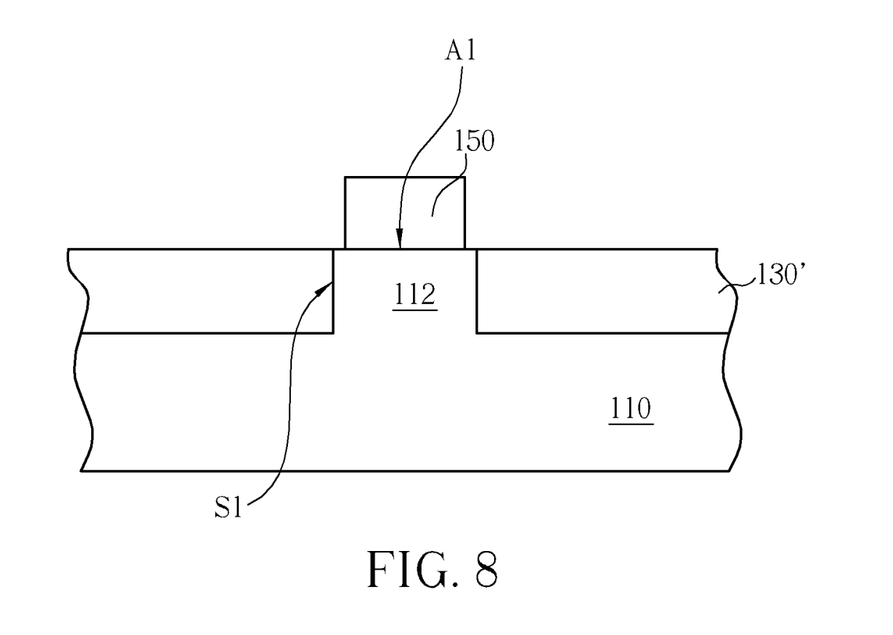
Figure 9:
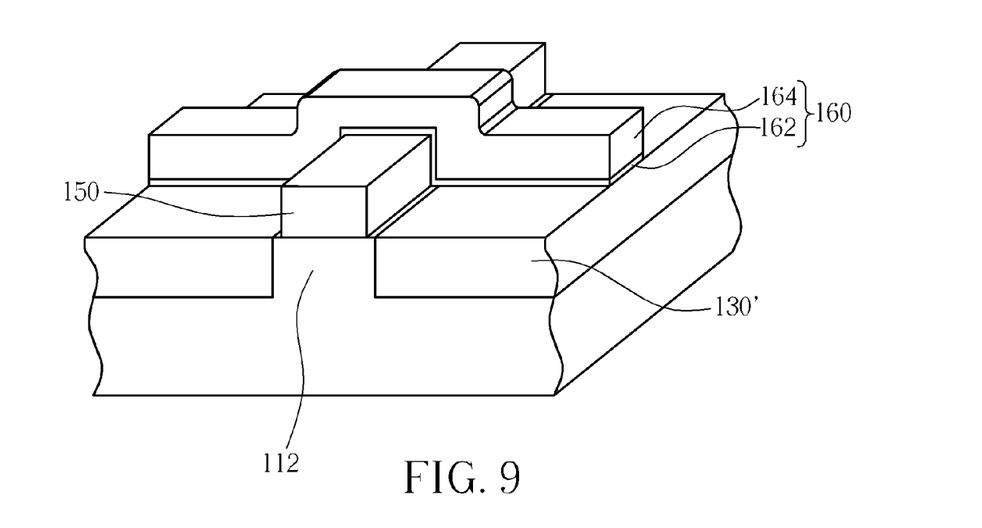
FIG. 9 schematically depicts a three dimensional diagram of a semiconductor process according to a first embodiment of the present invention.

As shown in FIG. 8, the patterned isolation layer 130 may be selectively etched back, so that the epitaxial structure 150 extending from the fin-shaped structure 112 can protrude from the patterned isolation layer 130', and then the silicon rich layer 140 is removed, to form a tri-gate MOSFET in later processes. In another embodiment, the patterned isolation layer 130 may be selectively etched back until the fin-shaped structure 112 protruding from the patterned isolation layer 130'. As shown in FIG. 9, a gate structure 160 is formed across parts of the epitaxial structure 150 and the fin-shaped structure 112, wherein the gate structure 160 may include a gate dielectric layer 162, a gate electrode 164, a spacer (not shown), etc. The gate dielectric layer 162 may be a dielectric layer having a high dielectric constant, such as a group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST). The gate structure 160 may include a polysilicon gate or a metal gate including a barrier layer, a work function metal layer and a main conductive layer, etc. Furthermore, a lightly doped source/drain region and a source/drain region (not shown) may be sequentially formed; a metal silicide, a contact hole etch stop layer, an interdielectric layer and contact plugs such as metal plugs may be formed. These processes are known in the art and are therefore not described herein.

Figure 12:
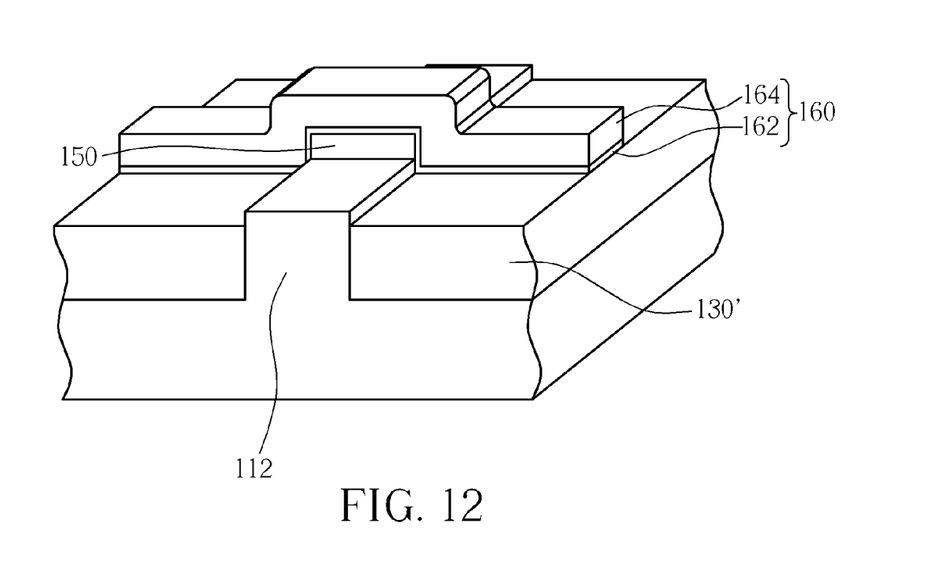
FIG. 12 schematically depicts a three dimensional diagram of a semiconductor process according to an embodiment of the present invention.

The epitaxial structure 150 in this embodiment entirely covers the fin-shaped structure 112, so that sequentially formed structures such as the gate structure 160, the source/drain region or etc can be formed thereon or therein. In one case, the epitaxial structure 150 may be formed just between the fin-shaped structure 112 and the gate structure 160 (as shown in FIG. 12). In another case, the epitaxial structure 150 may be formed on the fin-shaped structure 112 other than the gate structure 160. For example, the epitaxial structure 150 may be formed on the location of the source/drain region, wherein the epitaxial structure 150 may be formed before/after the source/drain region is formed, or the epitaxial structure 150 may be formed together with the source/drain region. The location of the epitaxial structure depends upon the formed semiconductor structure and subsequent processes. Whatever the application is, the epitaxial structure can be improved by applying the method of the present invention.

According to the above, thanks to a silicon rich layer 140 being formed on the sidewalls S2 of the patterned isolation layer 130 (as shown in FIG. 5) before the epitaxial structure 150 is formed on the silicon area A1, the epitaxial structure 150 can grow on the silicon rich layer 140. Thus, the desired shape of the epitaxial structure 150 can be made, and structures formed thereon can therefore contact the epitaxial structure 150 smoothly and uniformly. The volume of the epitaxial structure 150 can get close to a maximum size and the space can be used effectively for achieving better transistor performances.

In the first presented embodiment the epitaxial structure is first formed and the gate structure only after. A second embodiment will be presented, wherein the gate structure is formed before the epitaxial structure.

Figure 10:
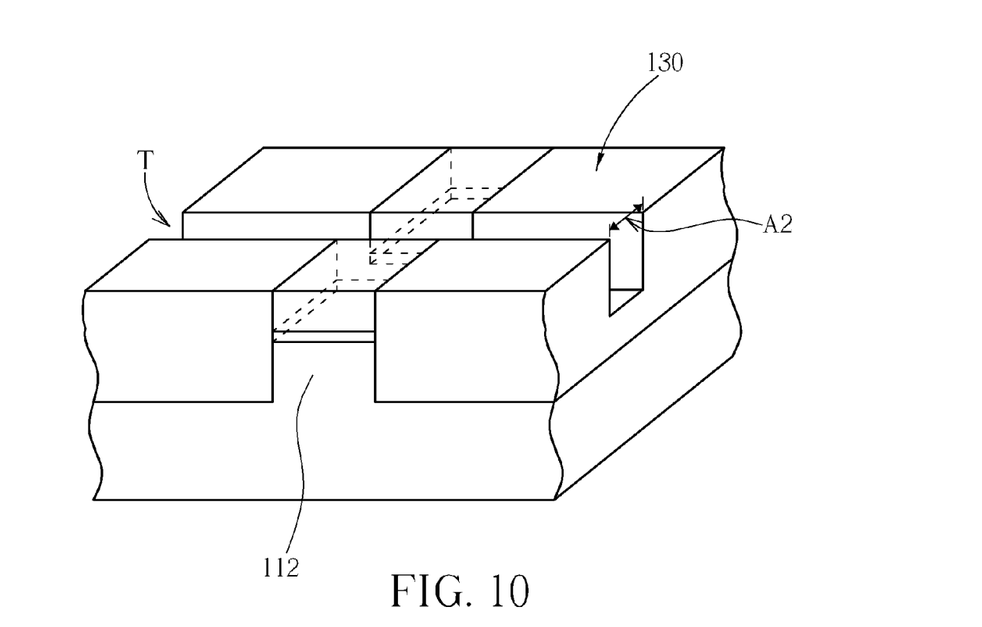
FIGS. 10-11 schematically depict three dimensional diagrams of a semiconductor process according to a second embodiment of the present invention.
Figure 11:
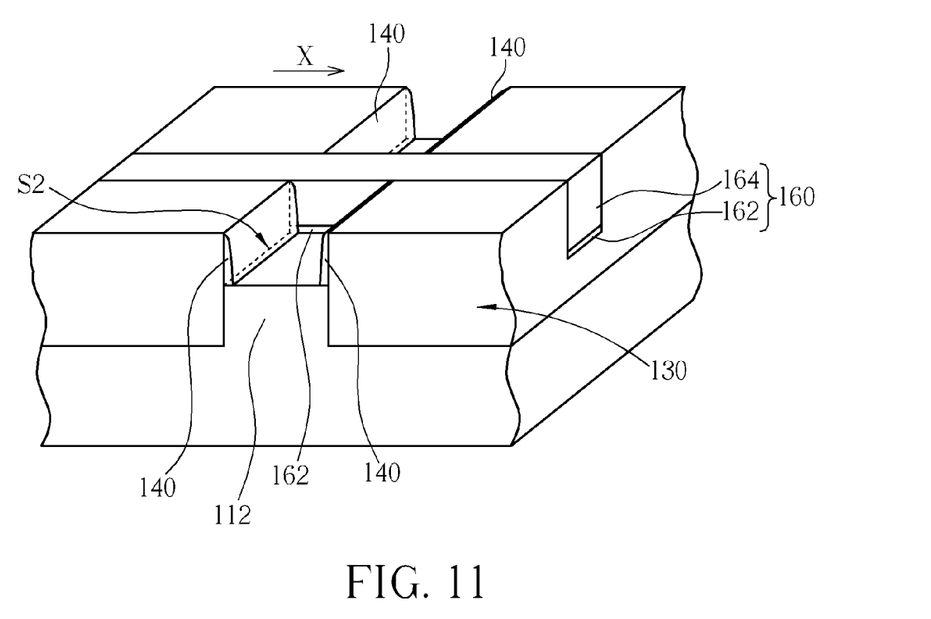

FIGS. 10-11 schematically depict three dimensional diagrams of a semiconductor process according to a second embodiment of the present invention. The steps of FIGS. 1-3 are performed, so that a semiconductor substrate 110 having a fin-shaped structure 112 is formed; a patterned isolation layer 130 is formed in the semiconductor substrate 110; and a hard mask layer 120 is removed to expose the fin-shaped structure 112 below it. Then, as shown in FIG. 10, some areas A2 of the patterned isolation layer 130 are back etched so that the fin-shaped structure 112 protrudes from some areas A2 of the patterned isolation layer 130, and a gate trench T crossing the fin-shaped structure 112 is therefore formed. In another embodiment, a plurality of the gate trenches T may be formed in the patterned isolation layer 130.

As shown in FIG. 11, a gate structure 160 is formed in the gate trench T and on the fin-shaped structure 112. The gate structure 160 may include agate dielectric layer 162, agate electrode 164, a spacer (not shown), etc. The gate dielectric layer 162 may be a dielectric layer having a high dielectric constant, which is the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_1\text{-}xO_3$, PZT) and barium strontium titanate ($Ba_xSr_1\text{-}xTiO_3$, BST). The gate structure 160 may include a polysilicon gate or a metal gate including a barrier layer, a work function metal layer and a main conductive layer etc. A silicon rich layer 140 is formed on the sidewalls S2 of the patterned isolation layer 130 by the aforesaid method, and then the epitaxial structure (not shown) is formed on the fin-shaped structure 112 excepting the gate structure 160. Therefore, the epitaxial structure (not shown) can grow on the silicon rich layer 140 and the epitaxial structure (not shown) and therefore adhering to the patterned isolation layer 130. In another embodiment, a recess may be etched and formed in the corresponding source/drain region on the fin-shaped structure 112 after the gate structure 160 is formed. Then, the silicon rich layer 140 is formed on the sidewalls S2 of the patterned isolation layer 130 by aforesaid method and the epitaxial structure (not shown) is formed in the recess. In a preferred embodiment, the recess (not shown) has a diamond-shaped profile structure enabling the epitaxial structure formed therein to have better performances for forcing stresses into the gate channel. However, regardless of the epitaxial structure being formed in or on the fin-shaped structure 112, the two ends of the epitaxial structure along the X-axis will contact and adhere to the silicon rich layer 140 on the sidewall S2 of the patterned isolation layer 130. In other words, a silicon rich layer 140 should be formed on the sidewalls S2 of the patterned isolation layer 130 before the epitaxial structure (not shown) is formed so that the epitaxial structure can grow on the silicon rich layer 140.

Furthermore, after the epitaxial structure (not shown) is formed, a lightly doped source/drain region, a source/drain region (not shown), a metal silicide, a contact hole etch stop layer, an interdielectric layer, and contact plugs such as metal plugs may be formed. These processes are known in the art and not described again.

There are just two embodiments in the above, but the present invention can also be applied to various semiconductor processes. The methods for forming at least a silicon rich layer for an epitaxial structure being formed and growing thereon should belong to the scope of the present invention.

Above all, the present invention provides a semiconductor process, which forms at least a silicon rich layer on the sidewalls of the patterned isolation layer, so that the epitaxial structure can grow on the silicon rich layer as the epitaxial structure is formed on a silicon substrate. That is, the epitaxial structure formed by the present invention can adhere to the patterned isolation layer, enabling the epitaxial structure to achieve best performances. For example, the epitaxial structure formed by the present invention has a desired shape benefit for structures being formed thereon and contacting with it uniformly. Furthermore, the epitaxial structure of the present invention can reach a maximum volume for fully using spaces and obtain better transistor performances.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
   providing a semiconductor substrate, wherein the semiconductor substrate has a fin-shaped structure and a patterned isolation layer and an opening of the patterned isolation layer exposes a silicon area which is the top surface of the fin-shaped structure;
   forming a silicon rich layer on the sidewalls of the opening; and
   performing an epitaxial process to form an epitaxial structure on the silicon area in the opening.

2. The semiconductor process according to claim 1, wherein the epitaxial structure is formed by adhering to the silicon rich layer.

3. The semiconductor process according to claim 1, wherein the patterned isolation layer comprises a shallow trench isolation structure.

4. The semiconductor process according to claim 1, wherein the steps of forming the patterned isolation layer comprise:
   forming a plurality of recesses in the semiconductor substrate;
   forming a liner on the sidewalls of each of the recesses; and
   filling an isolation material in each of the recesses.

5. The semiconductor process according to claim 1, wherein the steps of forming the silicon rich layer comprise:
   entirely forming a silicon rich film on the semiconductor substrate and on the sidewalls and the top surface of the patterned isolation layer; and
   removing the silicon rich film on the semiconductor substrate and the top surface of the patterned isolation layer.

6. The semiconductor process according to claim 1, wherein the epitaxial structure entirely covers the fin-shaped structure.

7. The semiconductor process according to claim 1, wherein the epitaxial structure protrudes from the patterned isolation layer.

8. The semiconductor process according to claim 1, wherein the top surface of the epitaxial structure is below the top surface of the patterned isolation layer.

9. The semiconductor process according to claim 1, wherein the top surface of epitaxial structure is leveled with the top surface of the patterned isolation layer.

10. The semiconductor process according to claim 1, wherein the epitaxial structure comprises a silicon-germanium epitaxial structure, a silicon carbide epitaxial structure and a silicon epitaxial structure.

11. The semiconductor process according to claim 1, wherein the silicon content of the silicon rich layer is larger than one-third of the total content of the silicon rich layer.

12. The semiconductor process according to claim 11, wherein the silicon rich layer comprises a nitrogen containing silicon rich layer.

13. The semiconductor process according to claim 12, wherein the silicon rich layer comprises a silicon nitride ($Si_3N_4$) layer.

14. The semiconductor process according to claim 1, further comprising:
   etching back the patterned isolation layer enabling the epitaxial structure protruding from the patterned isolation layer after the epitaxial process is performed; and
   forming a gate structure on parts of the fin-shaped structure.

15. The semiconductor process according to claim 14, wherein the epitaxial structure is formed between the fin-shaped structure and the gate structure.

16. The semiconductor process according to claim 14, wherein the epitaxial structure is formed on the fin-shaped structure other than the gate structure.

17. The semiconductor process according to claim 1, further comprising:
   etching back some areas of the patterned isolation layer enabling the fin-shaped structure protruding from some areas of the patterned isolation layer before the silicon rich layer is formed, so that at least a gate trench is formed in the patterned isolation layer; and
   forming a gate structure in the gate trench and on the fin-shaped structure.

18. The semiconductor process according to claim 17, wherein the epitaxial structure is formed on the fin-shaped structure other than the gate structure.

* * * * *